United States Patent
Koh

(10) Patent No.: US 7,105,435 B2
(45) Date of Patent: Sep. 12, 2006

(54) METHODS OF FORMING A CONTACT HOLE IN A SEMICONDUCTOR DEVICE

(75) Inventor: Kwan-Ju Koh, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 63 days.

(21) Appl. No.: 10/749,578

(22) Filed: Dec. 30, 2003

(65) Prior Publication Data

US 2004/0157439 A1 Aug. 12, 2004

(30) Foreign Application Priority Data

Jan. 30, 2003 (KR) .................. 10-2003-0006405

(51) Int. Cl.
*H01L 21/4763* (2006.01)
(52) U.S. Cl. ...................... 438/637; 438/713
(58) Field of Classification Search ............... 438/710, 438/713, 723, 724, 637–640
See application file for complete search history.

(56) References Cited

U.S. PATENT DOCUMENTS

| 5,189,446 | A |   | 2/1993  | Barnes et al. |
|-----------|---|---|---------|---------------|
| 5,302,266 | A |   | 4/1994  | Grabarz et al. |
| 5,658,425 | A |   | 8/1997  | Halman et al. |
| 5,681,780 | A | * | 10/1997 | Mihara et al. ............. 438/700 |
| 5,843,236 | A |   | 12/1998 | Yoshiki et al. |
| 5,940,730 | A | * | 8/1999  | Kwak et al. ............... 438/637 |
| 5,998,870 | A | * | 12/1999 | Lee et al. ................... 257/751 |
| 6,030,667 | A |   | 2/2000  | Nakagawa et al. |
| 6,551,445 | B1|   | 4/2003  | Yokogawa et al. |

* cited by examiner

*Primary Examiner*—Richard A. Booth
(74) *Attorney, Agent, or Firm*—Andrew D. Fortney

(57) ABSTRACT

Methods for forming a contact hole in a semiconductor device are disclosed. A disclosed method is capable of preventing voids from being formed in a contact hole or a via hole. In particular, when a metal insulation film or an interlayer insulation film is selectively etched to form a contact hole or a via hole, a top edge of the contact hole or the via hole is rounded by using a plasma having spiral movement.

18 Claims, 2 Drawing Sheets

METHODS OF FORMING A CONTACT
HOLE IN A SEMICONDUCTOR DEVICE

FIELD OF THE DISCLOSURE

The present disclosure relates generally to methods of fabricating semiconductor devices, and more particularly to methods for forming a contact hole or via holes in a semiconductor device by selectively etching a metal insulation film or an interlayer insulation film.

BACKGROUND

With the trend toward higher and higher integration of semiconductor devices, the width dimension of contact holes or via holes becomes smaller. Accordingly, the aspect ratios of these contact holes or via holes are increasing.

With the increase of the aspect ratios of the contact holes or the via holes, it becomes more difficult to completely fill the contact hole or the via holes with metal material without leaving any voids.

Conventional techniques for forming these contact holes in semiconductor devices are described in U.S. Pat. No. 6,551,445, U.S. Pat. No. 6,030,667, U.S. Pat. No. 5,658,425, U.S. Pat. No. 5,302,266, and U.S. Pat. No. 5,189,446.

FIG. 1 is a sectional view illustrating a conventional method for forming contact holes in a semiconductor device. As shown in that figure, after performing a typical MOS transistor fabrication process for forming a gate 2 of a predetermined width on a silicon wafer 1 defined as an active area of the device, a silicide 3 is formed on the top surfaces of the gate 2 and the silicon wafer 1 in the active area.

Next, a metal insulation film 4 is thickly formed on the entire top surface of the silicon wafer 1. The metal insulation film 4 is then planarized by a chemical and mechanical polishing process.

After a contact hole 100 is formed by selectively etching the metal insulation film 4, a barrier metal film 5 is formed on an inner wall of the contact hole 100. Metal material 6 for filling the contact hole 100 is then formed on the barrier metal film.

When the metal insulation film 4 is etched by a conventional method, a top edge of the formed contact hole has a shape close to a right angle.

Because the aspect ratio of the contact hole 100 is relatively large, the barrier metal film 5 is not deposited at a uniform thickness on the inner wall of the contact hole. Accordingly, the barrier metal film 5 is deposited more thickly at an inlet portion of the contact hole 100 than at a deep portion of the contact hole 100 and an overhang occurs.

Due to the overhang, when the metal material 6 is formed to fill the contact hole 100, the inlet portion of the contact hole 100 is blocked before the deep portion of the contact hole 100 is completely filled. As a result, a void 200, (i.e., an empty space in which the metal material is not filled), remains in the contact hole 100.

Impurities may enter such a void 200 during subsequent processes. These impurities may result in a fatal error in the operation of the semiconductor device.

DETAILED DESCRIPTION

Figure 1:
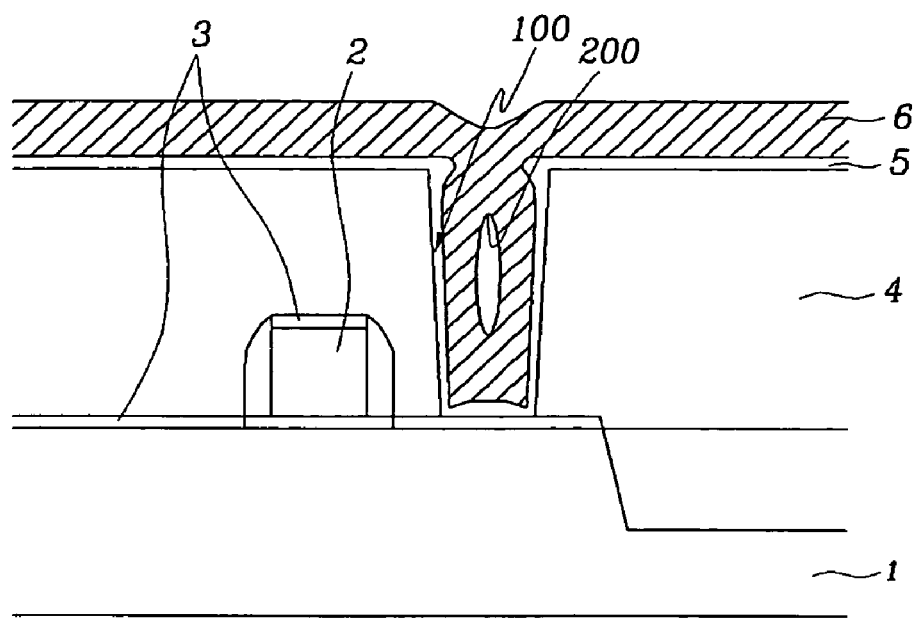
FIG. 1 is a sectional view illustrating a conventional method for forming a contact hole in a semiconductor device.
Figure 2A:
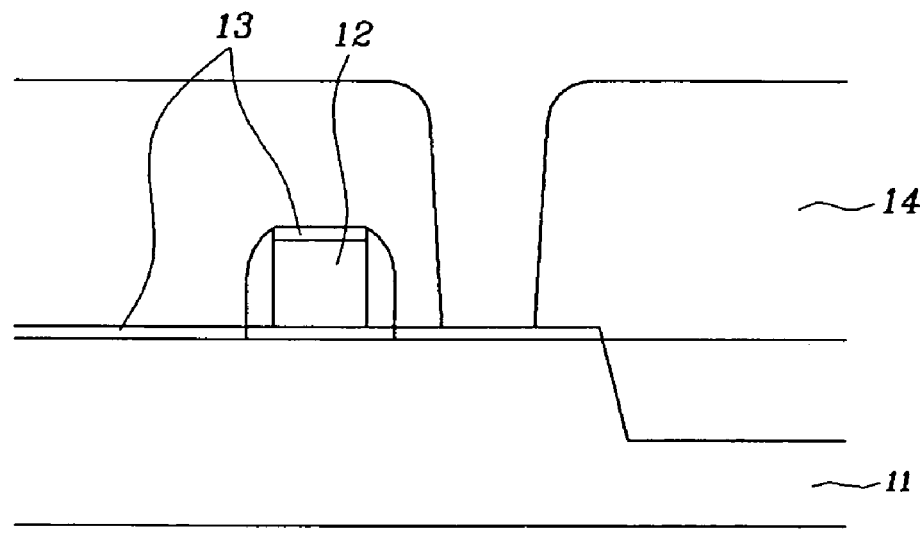
FIGS. 2a and 2b are sectional views illustrating an example method for forming a contact hole in a semiconductor device in accordance with the teachings of the present disclosure.
Figure 2B:
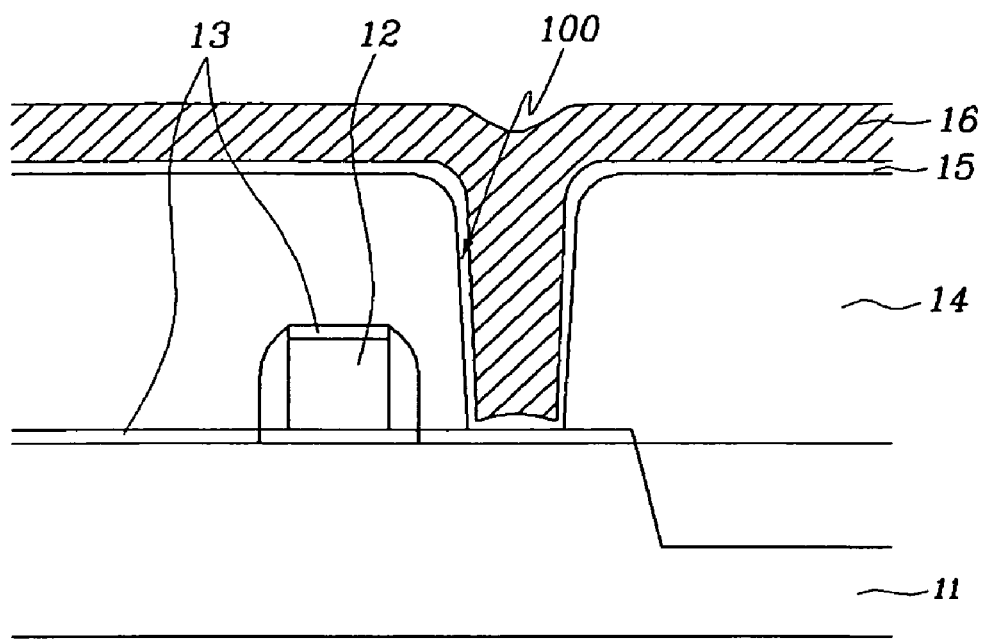

FIGS. 2a and 2b are sectional views illustrating an example method for forming a contact hole in a semiconductor device. As shown in FIG. 2a, after performing a typical MOS transistor fabrication process for forming a gate 12 of a predetermined width on a silicon wafer 11 defined as an active area of the device, a silicide 13 is formed on the top surfaces of the gate 12 and the silicon wafer 11 in the active area.

Subsequently, a metal insulation film 14 is thickly formed on the entire top surface of the silicon wafer 11. The metal insulation film 14 is then planarized by a chemical and mechanical polishing process.

Next, a photosensitive film is applied, exposed and developed on the metal insulation film 14 such that a photosensitive film pattern is formed. The photosensitive film pattern is formed such that the photosensitive film on a region to contain a contact hole is removed. A contact hole 100 is then formed by dry etching the exposed area of the metal insulation film 14 using the photosensitive film pattern as a mask.

When the metal insulation film 14 is dry etched, a top edge of the contact hole is rounded by isotropically etching the metal insulation film 14 using a plasma having spiral movement.

The plasma having spiral movement is widely used in equipment for removal of photosensitive film in process lines. This equipment, which is called an asher, includes equipment having a representative brand name of Ramda-200.

The principle of this equipment is that charged ions or radicals have spiral movement as the ions or radicals are rotated by a magnetic field. This magnetic field is generated by a coil surrounding a chamber under a state where an electric field is applied vertically downward in the chamber.

When this equipment is used, gases of the fluorine series can be used as an etching gas.

Next, as shown in FIG. 2b, a barrier metal film 15 is formed on the entire top surface of the metal insulation film 14 and an inner wall of the contact hole 100. A metal material 16 for filling the contact hole 100 is then formed on the barrier metal film 15.

Since the top edge of the contact hole 100 is rounded, an inlet portion of the contact hole 100 is widened, thereby preventing generation of an overhang when forming the barrier metal film 15. Accordingly, the contact hole 100 is completely filled with the metal material 16 without creating any voids.

Although as described above, the illustrated method is applicable to selectively etching a metal insulation film to form a contact hole, the teachings of the present disclosure are also applicable to a case where the interlayer film is selectively etched for the formation of a via hole.

As described above, when a metal insulation film or an interlayer insulation film is etched to form a contact hole or a via hole, since a top edge of the contact hole or the via hole is rounded by using a plasma having spiral movement, an inlet portion of the contact and/or via hole is widened and generation of an overhang at the inlet when forming the barrier metal film is prevented. Accordingly, the contact and/or via hole is completely filled with metal material without any voids. As a result, defects caused by voids can be prevented, thereby improving the reliability of semiconductor devices.

From the foregoing, persons of ordinary skill in the art will appreciate that the above disclosed methods prevent voids from being formed in a contact hole or a via hole. To this end, a top edge of a contact hole or a via hole is rounded by using a plasma having spiral movement when a metal insulation film or an interlayer insulation film is etched to form the contact hole or the via hole.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for forming a contact hole or a via hole in a semiconductor device comprising:
    applying, exposing and developing a photosensitive film on a planarized metal insulation film or a planarized interlayer insulation film to form a photosensitive film pattern on a region to contain the contact hole or the via hole; and
    dry etching the planarized metal insulation film or the planarized interlayer insulation film using the photosensitive film pattern as a mask and using a plasma having spiral movement sufficiently to form the contact hole or the via hole and round a top edge of the contact hole or the via hole thereby.

2. A method as defined in claim 1, wherein, the plasma comprises a fluorine-containing etching gas.

3. A method as defined in claim 1, further comprising:
    after forming the contact hole or the via hole, forming a barrier metal film on an inner wall of the contact hole or the via hole; and
    filling the contact hole or the via hole with a metal material.

4. A method as defined in claim 3 wherein filling the contact hole or the via hole with the metal material comprises forming the metal material on the barrier metal film.

5. A method as defined in claim 3, further comprising:
    after forming the contact hole or the via hole, forming a barrier metal film on an inner wall of the contact hole or the via hole; and
    filling the contact hole or the via hole with a metal material.

6. A method as defined in claim 5 wherein filling the contact hole or the via hole with the metal material comprises forming the metal material on the barrier metal film.

7. The method of claim 1, wherein the dry etching step is performed in an asher.

8. The method of claim 1, wherein the dry etching step comprises rotating the plasma in a magnetic field, the magnetic field generated by a coil surrounding a chamber under a state where an electric field is applied vertically downward in the chamber.

9. A method for forming a contact hole or a via hole in a semiconductor device comprising:
    applying, exposing and developing a photosensitive film on a planarized insulation film to form a photosensitive film pattern; and
    dry etching the planarized insulation film using the photosensitive film pattern as a mask and using a plasma having spiral movement sufficiently to form the contact hole or the via hole and round a top edge of the contact hole or the via hole thereby.

10. A method as defined in claim 9, wherein the insulation film comprises a metal insulation film.

11. A method as defined in claim 9, wherein the insulation film comprises an interlayer insulation film.

12. A method as defined in claim 9, wherein the plasma comprises a fluorine-containing etching gas.

13. A method us defined in claim 9, further comprising:
    after forming the contact hole or the via hole, forming a barrier metal film on an inner wall of the contact hole or the via hole; and
    filling the contact hole or the via hole with a metal material.

14. A method as defined in claim 13 wherein filling the contact hole or the via hole with the metal material comprises forming the metal material on the barrier metal film.

15. A method as defined in claim 12, further comprising:
    after forming the contact hole or the via hole, forming a barrier metal film on an inner wall of the contact hole or the via hole; and
    filling the contact hole or the via hole with a metal material.

16. A method as defined in claim 15 wherein filling the contact hole or the via hole with the metal material comprises forming the metal material on the barrier metal film.

17. The method of claim 9, wherein the dry etching step is performed in an asher.

18. The method of claim 9, wherein the dry etching step comprises rotating the plasma in a magnetic field, the magnetic field generated by a coil surrounding a chamber under a state where an electric held is applied vertically downward in the chamber.

* * * * *